United States Patent

Senateur et al.

[11] Patent Number: 5,945,162
[45] Date of Patent: *Aug. 31, 1999

[54] METHOD AND DEVICE FOR INTRODUCING PRECURSORS INTO CHAMBER FOR CHEMICAL VAPOR DEPOSITION

[75] Inventors: Jean-Pierre Senateur, Meylan; Roland Madar, Eybens; Francois Weiss, Montbonnot; Olivier Thomas, Grenoble; Adulfas Abrutis, Saint Martin D'Heres, all of France

[73] Assignee: Centre National de la Recherche Scientifique, Paris, France

[*] Notice: This patent issued on a continued prosecution application filed under 37 CFR 1.53(d), and is subject to the twenty year patent term provisions of 35 U.S.C. 154(a)(2).

[21] Appl. No.: 08/583,090
[22] PCT Filed: Jul. 8, 1994
[86] PCT No.: PCT/FR94/00858
  § 371 Date: Jun. 17, 1996
  § 102(e) Date: Jun. 17, 1996
[87] PCT Pub. No.: WO95/02711
  PCT Pub. Date: Jan. 26, 1995

[30] Foreign Application Priority Data

Jul. 12, 1993 [FR] France .................................. 93 08838

[51] Int. Cl.$^6$ .................................................. C23C 16/00
[52] U.S. Cl. ..................................... 427/248.1; 427/255.1; 118/725
[58] Field of Search .............................. 427/248.1, 255.1; 118/726, 728, 725

[56] References Cited

U.S. PATENT DOCUMENTS

| | | |
|---|---|---|
| 5,085,731 | 2/1992 | Norman et al. ........................ 427/253 |
| 5,090,985 | 2/1992 | Soubeyrand et al. ................... 427/167 |
| 5,278,138 | 1/1994 | Ott et al. ............................... 427/314 |
| 5,316,579 | 5/1994 | McMillan et al. ...................... 427/226 |
| 5,393,564 | 2/1995 | Westmoreland et al. ............. 427/248.1 |
| 5,441,766 | 8/1995 | Choi et al. ............................. 427/250 |
| 5,451,260 | 9/1995 | Versteeg et al. ..................... 427/248.1 |
| 5,492,724 | 2/1996 | Klinedinst et al. ................... 427/248.1 |

Primary Examiner—Michael Lusignan
Assistant Examiner—Bret Chen
Attorney, Agent, or Firm—Arthur L. Plevy

[57] ABSTRACT

A method is disclosed for introducing into a chemical vapor deposition chamber precursors of elements to be deposited over a heated substrate. The method comprises the steps of maintaining one or more precursors in liquid form or in solution at a pressure higher than the pressure of the chamber; injecting periodically and under control in the deposition chamber precursor droplets each of the droplets having a controllable volume; volatizing the injected precursor droplets to produce evaporated precursors, and conveying toward the substrate the evaporated precursors at a temperature and pressure of the chamber, whereby the evaporated precursors react to produce the elements deposited onto the substrate. A device for performing the same is also disclosed and includes at least one tank containing precursors in liquid form or in solution; means for maintaining each tank at a pressure higher than the pressure of the chamber; at least one controlled injector associated with each tank and provided with control means for periodically injecting controlled amounts of precursor droplets into the deposition chamber; means for volatizing said injected precursor droplets to produce evaporated precursors, and means for conveying the evaporated precursors to the substrate disposed in the deposition chamber.

11 Claims, 2 Drawing Sheets

METHOD AND DEVICE FOR INTRODUCING PRECURSORS INTO CHAMBER FOR CHEMICAL VAPOR DEPOSITION

BACKGROUND OF THE INVENTION

1. Field of the Invention

The present invention relates to a method and a device for depositing thin layers by chemical vapor deposition (CVD), possibly by low pressure chemical vapor deposition (LPCVD).

2. Discussion of the Related Art

According to a so-called CVD method, the chemical elements to be deposited are conveyed directly or in the form of gas compounds (precursors) to a deposition chamber where is placed a substrate on which deposition must be achieved. The mixture is introduced into an area where the reaction occurs, activated by an energy input (temperature increase, plasma, photons, and so on), the reaction generally provides only a single solid compound. Gas residues are evacuated outside of the reactor.

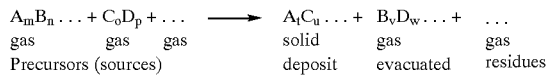

$$A_m B_n \ldots + C_o D_p + \ldots \longrightarrow A_t C_u \ldots + B_v D_w \ldots + \ldots$$

gas    gas   gas                    solid        gas        gas
Precursors (sources)                deposit      evacuated  residues The method generally uses as many sources as elements present in the compound to synthesize. One or more carrier gases, which may be neutral or may participate to the reaction, convey the precursor vapors up to the deposition area.

In the CVD method, one of the problems encountered is the introduction of precursors into the deposition chamber.

FIG. 1 schematically illustrates the problem to solve. A chamber 1 is maintained at a temperature and at a pressure adapted to the deposition on a substrate 2, which is generally heated. One or more pipes 3 lead into the airtight chamber for introducing diluent or reactive carrier gases and pipes 4, 5, 6 for introducing gaseous precursors into the airtight chamber.

If precursors are initially gaseous at room temperature, there are few problems. If the precursors are in liquid or solid phase, it is necessary to heat them in tanks 7, 8, 9 to volatilize them and therefore to obtain a sufficient vapor pressure in order to convey the material by a carrier gas.

In the particular case where one or more solid or liquid sources are used, it is necessary to perfectly stabilize the temperature and the flow of the carrier gas of each source to set the composition of the deposition. Thus, for a compound including n elements, the temperature and the flow of each source must be controlled, i.e., 2n parameters. In addition, when a solid in the form of a powder is heated to be vaporized, its evaporation surface may often be blocked by impurities or by oxidation by humidity traces in the carrier gas, which causes the surface to change and the performance to be unsteady. This surface also varies while the solid source is consumed. Furthermore, in the case of solids having very high sublimation temperatures, this temperature must be maintained in the whole pipe between the source and the chamber. This raises several problems, i.e., basic problems as regards the possible decomposition of unsteady precursors in the source or in the path between the source and the deposition chamber, and technical problems for the fabrication of valves adapted to withstand high temperatures.

Several solutions have been proposed in the prior art to overcome these problems.

A first solution consists of regularly taking small amounts of precursor powder in the solid phase and introducing them directly into the evaporator where they are immediately evaporated. This method enables one to obtain a controlled vapor flow even with thermally unsteady precursors because only the small amount of precursor is heated at high temperature in the deposition chamber after introduction into this chamber. However it is clear that the method has the following drawbacks.

It is difficult to accurately measure the injection of regular powder amounts. This requires a perfect control of the granulometry and the fabrication of a device capable of injecting micro amounts of powders (some $10^{-6}$ grams of powder per injection).

The devices for measuring powders are not accurate enough to allow the use of several solid injectors in parallel to synthesize compounds comprising several elements. In order to simultaneously inject several precursors, it is necessary to use mixtures comprising perfectly homogeneous powders (both for the composition and for the particle size distribution) which raises a technical problem, which is difficult to solve.

A second solution consists of using a nebulization method. The liquid or solid precursors that are melt in a solvent, to obtain a liquid source, are turned into aerosols by ultrasonic nebulizers. The aerosol is conveyed up to the deposition area by an active or neutral carrier gas. Various liquid precursors or precursors in solution can be mixed before being transformed into an aerosol. Generally, a single source is used, whereas it is possible to use several aerosol generators in parallel. The method is advantageous over the conventional CVD method in that the concentration ratio of the different elements brought in the deposition area remains constant over time if there is only one source. Only the total flow can vary if the solution viscosity varies. However, it is clear that the solution has the main following drawbacks.

The ultrasonic production of aerosol causes the solution to be heated, and thereby viscosity variation. Therefore, it is very difficult to stabilize the aerosol production (that is the reason why there is generally only one source and, if a device with several sources is possible, it is seldom used). The system is difficultly usable for fabricating alternated multilayers in a single operation.

The ultrasonic excitation required to generate an aerosol may, in some cases, activate a chemical reaction between the precursors and, possibly, the solvent of a solution. This causes a modification of the amounts of precursors brought into the reaction area, which is detrimental for the quality of deposition.

Only liquids or solutions having a low viscosity can be nebulized. This requires the use of very fluid solvents and generally dilute solutions, therefore low partial vapor pressures of the precursors in the substrate area.

Since the solutions used are unavoidably dilute because of viscosity, a large amount of solvent is present in the vapor phase in the reaction area. This important vapor amount of solvent at the substrate may cause spurious reactions that are detrimental for the quality of depositions.

In several cases, the carrier gas cooperates to the reaction (for example, oxygen or air for oxide depositions, ammonia for nitride depositions, hydrogen sulfide for nitride depositions). The mixture of a reactive gas with important amounts of organic solvent may cause explosive reactions in the reactor. The risk of explosion may be limited by using low pressure, but it is then necessary to use a solvent with a low vapor pressure to prevent the sources from boiling. The need for low vapor pressure and low viscosity solvents substantially reduces the selection of usable solvents.

SUMMARY OF THE INVENTION

A main object of the present invention is to provide a device for introducing deposition precursors into a CVD deposition chamber which avoids the drawbacks of the prior art methods and which is particularly simple to use.

A more specific object of the present invention is to provide such a device in which a perfect stabilization of the vapor pressure of the precursors in the deposition area is obtained, the precursors being mixed with or separated from solvent vapors (even with thermally unsteady precursors).

A further object of the present invention is to provide such a device at a minimum cost using conventional and suitable fluid compounds.

Another specific object of the present invention is to provide such a device with which multilayer systems or systems with composition gradient layers can be achieved in a simple way.

The invention applies to any liquid precursor or precursor in solution and particularly in the case where at least some of the elements acting on the deposition reaction are elements having a high vaporization temperature (ranging from 500 to 1000° C.).

To achieve these objects, the present invention provides a method, for introducing into a chemical vapor deposition chamber elements to be deposited on a hot substrate or precursors of these elements, comprising the steps of maintaining one or more liquid precursors or precursors in solution at a pressure higher than the pressure of the chamber; periodically injecting in the deposition chamber droplets of the precursors having a determined volume; and conveying toward the substrate the evaporated precursors at the temperature and pressure of the chamber.

The invention further provides a device for introducing into a chemical vapor deposition chamber precursors of one or more elements to be deposited on a hot substrate, including at least one tank containing one or more liquid precursors or precursors in solution, means for maintaining the tank at a pressure higher than the pressure of the chamber, at least one injector associated with each tank provided with control means for periodically injecting precursor droplets having a determined volume, and means for conveying the injected products up to the substrate disposed in the chamber.

According to an embodiment of the invention, the device includes a heated substrate holder.

According to an embodiment of the invention, the deposition chamber includes a heated plate on which the droplets are projected.

According to an embodiment of the invention, the deposition chamber is partitioned into two portions by a porous material.

According to an embodiment of the invention, the deposition chamber is partitioned into a first portion which constitutes an evaporator and a second portion at a higher temperature which constitutes a deposition chamber.

According to an embodiment of the invention, the means for conveying the injected products include means for injecting carrier gases located in an intermediate area of the deposition chamber between the injector and the substrate for conveying, in combination with a pump disposed behind the substrate, the gaseous precursors to this substrate and for conveying the fast evaporated portions of the droplet solvent to a gas vent.

The foregoing and other objects, features, aspects and advantages of the invention will become apparent from the following detailed description of the present invention when taken in conjunction with the accompanying drawings wherein:

DETAILED DESCRIPTION

Figure 1:
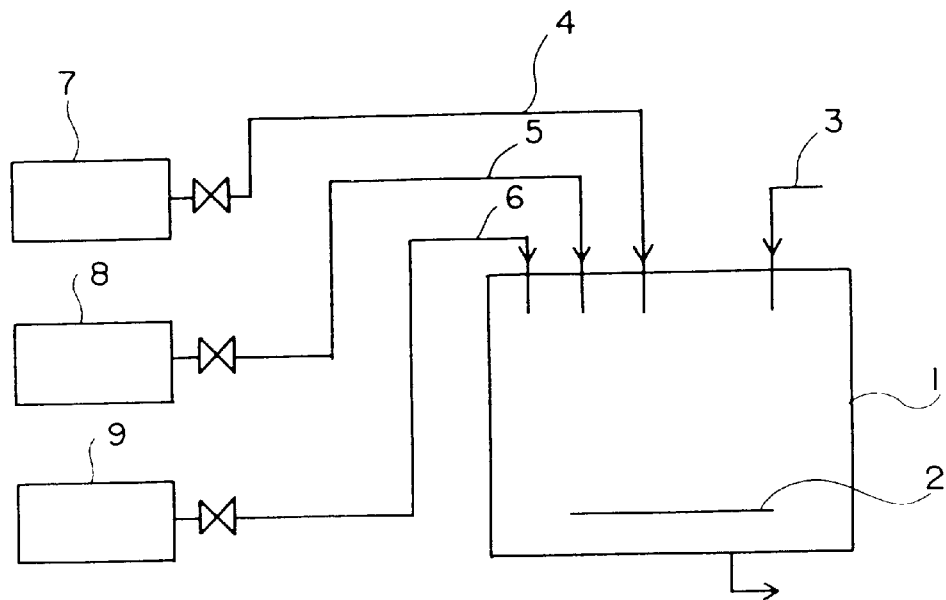
FIG. 1, above described, is a schematic illustration of the structure of a conventional system for introducing deposition precursors in a CVD chamber.
Figure 2:
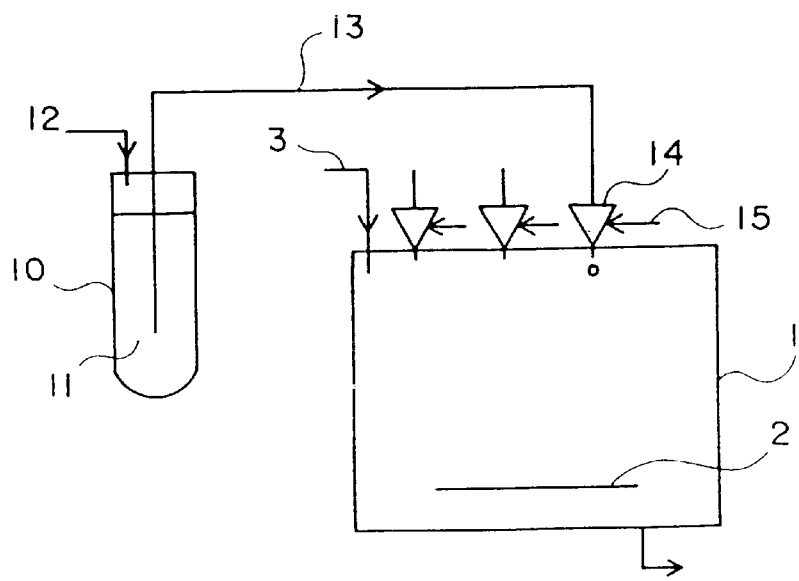
FIG. 2 is a schematic illustration of the structure of a system for introducing deposition precursors in a CVD chamber according to the invention.

As schematically represented FIG. 2, the present invention consists of providing in one or more pressure tanks 10 a liquid precursor 11 or a solution of solid precursors. The temperature in the tank is selected to provide optimum conservation and non-reactivity of the precursors. The pressure may, for example, be provided by the introduction in the upper portion of the tank 10 of a gas 12 under pressure to maintain a high pressure, for example approximately 1 to 5 times the atmospheric pressure. The liquid 11 in the tank 10 is conveyed through a pipe 13 to the input of a controlled injector 14 which has a control input 15 controlled, for example, by a microprocessor. The injector 14 enables to inject at each operation a liquid droplet having a perfectly controlled and duplicable volume. A simple gasoline or diesel injector of a car thermal motor may be used.

In the deposition chamber 1, one or more carrier gases are introduced through a pipe 3 to convey the precursors, evaporated at the pressure and the temperature of the chamber, to the substrate where they will deposit through the conventional chemical vapor deposition reaction, possibly activated by thermal activation, plasma, photons, and so on.

The advantages of the method and device according to the invention over the methods and devices of the prior art are numerous. The main advantages are as follows.

According to a first advantage, the liquid precursor or the solution of solid precursors 11 is maintained under the pressure of a neutral gas, that may be very pure. In addition, in the tank 10, in pipe 13 and in injector 14, this liquid or this solution can be maintained at a selected temperature and not at the high temperature of the chamber 1. Using the terminology <<evaporator>> for designating the upper portion of the deposition chamber, this liquid is isolated from the evaporator by the valve of the injector and the input pressure of the injector can be several atmospheres. In order to ensure injection, the only pressure requirement in the evaporator is that the pressure be lower than the pressure in the tank 10, in pipe 13 and in injector 14.

According to a second advantage of the present invention the amount of precursors injected each time remains constant and may be accurately regulated by acting on one or more parameters:

the volume of the injected droplet is controlled by the pressure difference between the evaporator and the injector or by the opening duration of the injector, which may be controlled with a high accuracy by a microprocessor;

the amount of precursor injected by volume unity of the droplet may be controlled by the solution concentration;

the amount of liquid injected per unit time can be regulated by the frequency of the injector opening.

According to a third advantage of the present invention, the reaction can be obtained either by using a single injector receiving a mixture of liquid precursors or of their solution in a solvent or, for the synthesis of compounds comprising several elements, the reaction can be obtained by successive, simultaneous or delayed, injections of different precursors from several injectors.

According to a fourth advantage of the present invention, the use of a plurality of injectors successively opened during equal or different times with solutions of equal or different dilution allow the formation, without using complex vent systems, of multilayer depositions with a thickness that is easily controlled.

According to a fifth advantage of the present invention, the precursors can be maintained in the injector under the temperature and pressure conditions for which they are steady. There is no energy input or ultrasounds in the injector, which limits the possibility of spurious reactions in the source. The precursors are transformed into vapor only during the very short time separating injection from reaction. Only a very small amount of precursor is volatilized at each injection, which ensures stability of the provision of material in the deposition area over time, even for thermally unsteady precursors.

According to a sixth advantage of the present invention, the liquids and/or solvents used can be very volatile and relatively viscous. The solutions can be concentrated.

According to a seventh advantage of the present invention, which will become apparent from the following description, if very volatile solvents are used, they are volatilized in the evaporator near the injector before the precursors. The solvent vapors can then be eliminated by a counter-path gas flow. The liberated (solid or liquid) precursors can be conveyed by natural sedimentation or by a mechanical method (gas or solid) in a warmer area where they are turned into vapor. The vapor, conveyed by a neutral or active carrier gas, is used in the deposition reaction according to a method identical to conventional CVD. This enables one to solve the problem of the solid sources for CVD. By way of example of mechanical devices, the injected droplets can be projected on a wheel, a conveyor band or similar, which convey them into the evaporator between an initial evaporation area of the solvents and an evaporation area of the precursors near the reaction area. In the initial area, the gas flowing in the opposite direction eliminates the evaporated solvent.

According to an eighth advantage of the present invention, the amount of injected precursor at each time can be controlled by the frequency of the injections, the size of the droplets, or the dilution of the solution, which allows a very regular control of the growing speed. It is possible to obtain very low partial pressures of reactive gases and thus very low growth speed, or high partial pressures and therefore very high growth speed. Injection can be achieved in an area very close to the substrate. The transport duration of the precursor in the vapor phase is then very short, enabling the precursors to overheat significantly above their decomposition temperature and to obtain deposition reactions with vapor partial pressures which cannot be reached with conventional methods.

Finally, since the injection can be achieved close to the substrate, it is not necessary to use, as in the conventional method, hot pipes and valves between the sources and the deposition area.

Figure 3:
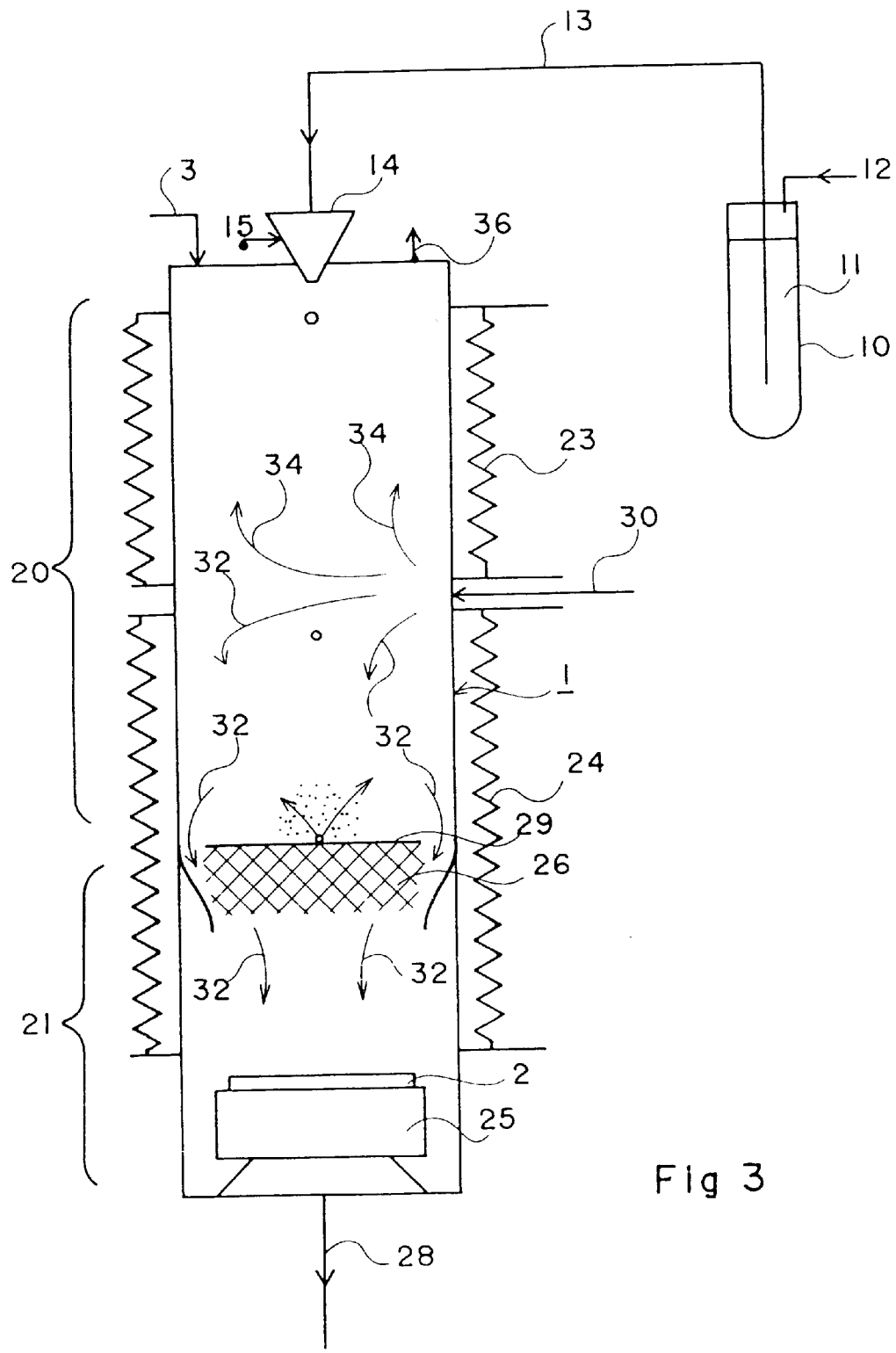
FIG. 3 is a more detailed representation of an embodiment of a system for introducing deposition precursors in a CVD chamber according to the invention.

FIG. 3 is a more detailed representation of an exemplary embodiment of an injection system associated with a CVD chamber according to the invention.

In FIG. 3, references 10–15 designate the same elements as in FIG. 2. The deposition chamber 1 is partitioned into two areas 20 and 21, called evaporator and reactor, respectively. Heating means maintain a selected temperature gradient in the chamber. By way of example, a heating with two heating resistors has been represented, for example, to maintain the upper portion of the evaporator at a temperature of approximately 60° C. and the lower portion of the evaporator and the reactor at a temperature of approximately 300° C. The substrate 2 is placed on a heating support 25 heated at the selected deposition temperature, for example, ranging approximately from 600 to 1000° C. In the represented embodiment, which is given only by way of example, the evaporator area 20 is separated from the reactor area by a porous separation 26, for example made of steel wool, used for better distribution of the gas and, if required, for maintaining a slight pressure gradient between the evaporator area and the reactor area. The lower portion of the reactor is connected to a pumping pipe 28 combined with a valve with controlled flow designed to maintain a selected pressure in the reactor, for example a pressure ranging from 1/10,000 times the atmospheric pressure and several times the atmospheric pressure.

A carrier gas, which may participate to the reaction, is also introduced into chamber 1 and especially conveys the injected precursors to the substrate. This carrier gas may be introduced through a pipe 3 leading into the chamber 1 near the injector. In addition, and preferably, the lower portion of the evaporation area comprises a plate 29 on which the droplets projected by the injector crash and very rapidly evaporate. A mechanical convey device can also be provided as indicated above.

In an alternative embodiment of the invention also represented, the carrier gas is introduced at an intermediate height in the deposition chamber, as indicated by an introduction pipe 30, to introduce a double gas flow. The first gas flow (arrow 32) is directed to the substrate and the evacuating pipe 28 and the second flow (arrow 34) is directed to a vent 36 whose aperture is close to the injection area. The advantage of the counter-flow 34 is that, if the solvent of the solution 11 containing the precursors is very volatile, a partial evaporation of the solvent occurs between the injection through the injector 14 and the crash of the droplets on the plate 29. The counter-flow 34 enables to evacuate through the vent 36 a portion of this fast evaporated solvent and to reduce a possible detrimental effect of a solvent in excess in the deposition area in the vicinity of the substrate 2.

Preferably, the area adjacent to the injector is cooled or rather maintained at the same temperature as the temperature of the tank 10 to prevent the injector and the liquid volume 11, contained in the admission chamber of the injector and waiting to be injected, from being heated.

Practical tests have been carried out by the applicant with a device such as that shown in FIG. 3 (devoid of counter-flow) and the following results have been obtained.

EXAMPLE 1

Deposition of a Layer of $Y_2O_3$

The precursor was Yttrium tetramethylheptanedionate or $Y(tmhd)_3$ in solution in ethanol (20 mg/ml). The tank 10 was at twice the atmospheric pressure ($2.10^5$ P). The gas regulating the pressure was nitrogen.

The pressure inside the reactor 21 was $10^3$ P. The carrier gas was air at a flow rate of 400 cm$^3$/min. The temperature of the substrate holder was 820° C.

900 injections of droplets of the solution have been made at a frequency of one injection per 1.5 seconds, the deposition duration was 1430 seconds and the volume of used liquid was 3.5 cm$^3$. Then, 200 nm of $Y_2O_3$ without any apparent crack detectable by electronic or optic microscope have been obtained over a substrate made of silicon or stainless steel.

EXAMPLE 2

Deposition of Y-doped $ZrO_2$

The solution contained in the tank 10 was $Zr(tmhd)_4$/Y $(tmhd)_3$ in solution in tetrahydrofurane. The conditions were approximately identical to those of Example 1 except that the injection frequency was two injections per second and the deposition duration was 400 seconds. 250 nm of $ZrO_2$ (Y) without any crack apparent by optic microscope was obtained.

EXAMPLE 3

Deposition of $YBa_2Cu_3O_{7-x}$ over MgO

In this case, the precursors were Y(tmhd)3 (6.4 mg/ml), Ba(tmhd)2 (13.5 mg/ml), Cu(tmhd)2 (10.8 mg/ml) in solution in tetrahydrofurane (a single source). The pressure in the tank 10 was 1.2 times higher than the atmospheric pressure ($1.2 \times 10^5$ P). The gas providing the pressure was nitrogen. The carrier gas was a mixture of air (200 cm$^3$/min) and oxygen (300 cm$^3$/min). The temperature of the substrate holder was 900° C.

400 injections were made at a frequency of one injection per second for a deposition duration of 400 seconds and a consumption of liquid volume of 5.1 ml.

The substrate was then cooled for half an hour under pure oxygen at atmospheric pressure and a pure $YBa_2Cu_3O_7$ compound was obtained with a perfect 001 texture (controlled by diffraction with X ray), having a critical temperature of 70° K.

EXAMPLE 4

Deposition of Titanium Oxide

The precursor was titanium etoxid (Ti(OTE)$_3$) in solution in tetrahydrofuran (dilution 1/5). The pressure in the tank 10 was 1.5 times the atmospheric pressure ($1.5 \times 10^5$ P). The gas providing the pressure was nitrogen.

a) The pressure in the reactor 21 was $10^3$ P. The carrier gas were nitrogen at a flow rate of 25 cm$^3$/mn and oxygen at a flow rate of 25 cm$^3$/min. The temperature of the evaporator 20 was 200° C. and the temperature of the substrate holder was 820° C. 300 injections of droplets of the solution were provided at a frequency of one injection per second. A 1000-nm thick titanium oxide layer was obtained over a silicon substrate.

b) Under identical conditions, except for the flows of gas (10 cm$^3$/min for oxygen and 40 cm$^3$/min for nitrogen, respectively), with 450 injections, a 200-nm thick titanium oxide layer was obtained.

EXAMPLE 5

Deposition of Tantalum Oxide

The precursor was tantalum etoxid diluted in tetrahydrofurane (dilution 1/20). The pressure in the tank 10 was twice the atmospheric pressure ($2.10^5$ P). The gas providing the pressure was nitrogen.

a) The pressure in the reactor 21 was $5.10^3$ P. The carrier gas was nitrogen at a flow rate of 50 cm$^3$/min. The temperature of the evaporator 20 was 200° C. and the temperature of the substrate holder 500° C. 500 injections of droplets of the solution tion were made at a frequency of one injection per second. A 200-nm thick tantalum oxide layer was obtained over a silicon substrate.

b) The pressure in the reactor 21 was $2.10^3$ P. The pressure in the tank 10 was $1.5 \times 10^5$ P. The carrier gas were nitrogen at a flow rate of 50 cm$^3$/min and oxygen at a flow rate of 20 cm$^3$/min. 600 injections of droplets of the solution were made at a frequency of one injection per second. A 350-nm thick tantalum oxide layer was obtained over a silicon substrate.

The above examples use a single injector. Satisfying test results have also been achieved by providing several injectors operating slightly delayed over time and also periodically.

The invention is liable of many alternatives, especially for the structure of the deposition chamber. This chamber is represented as vertical, the substrate being disposed at the bottom. Alternatively, the chamber may be inverted or made horizontal. In the particular embodiment described, the vaporization is mainly achieved on plate 29, which can be omitted, vaporization being then naturally achieved or, possibly, on the porous separator.

We claim:

1. A method for introducing into a chemical vapor deposition chamber precursors of elements to be deposited over a heated substrate by means of chemical vapor deposition, said method comprising the following steps:

maintaining one or more of said precursors in liquid form or in solution in a solvent at a pressure higher than the pressure of the chamber, periodically injecting a constant amount of said precursors in the form of droplets into the deposition chamber to control the growth rate of elements deposited on said heated substrate, wherein each of said droplets has a duplicable volume, introducing a counter-path gas flow into said chamber for evacuating evaporated solvent portions of said droplets to reduce the amount of vapor solvent;

volatizing said periodically injected precursor droplets to produce evaporated precursors, and conveying toward said heated substrate said evaporated precursors at a temperature and pressure of the chamber, whereby said evaporated precursors react to produce said elements deposited onto said heated substrate.

2. The method of claim 1, wherein said step of volatizing further includes: projecting the injected precursor droplets against a heated plate.

3. The method of claim 1, wherein the size of said droplets is controlled and duplicated by an injector.

4. A device for introducing into a chemical vapor deposition chamber precursors of one or more elements to be deposited on a heated substrate disposed in the chamber, including:

at least one tank containing one or more said precursors in liquid form or in solution in a solvent, said solvent having a higher volatility than said precursors, means for maintaining each said tank at a pressure higher than the pressure of the chamber, at least one injector associated with each said tank, each said injector provided with control means for controlling the amount of said precursors to be introduced into said deposition chamber by periodically injecting a constant amount of said precursors in the form of droplets into the deposition chamber, each of said droplets having a duplicable volume, wherein the growth rate of said elements on said heated substrate are controlled, counter-flow means for introducing a counter-path gas flow into said chamber for evacuating evaporated solvent portions of said droplets to reduce the amount of vapor solvent;

means for volatizing said injected precursor droplets to produce evaporated precursors, and means for conveying the evaporated precursors to the heated substrate disposed in the deposition chamber.

5. The device of claim 4, further including a heated substrate holder.

6. The device of claim 4, wherein the deposition chamber includes a heated plate on which the injected precursor droplets are projected.

7. The device of claim 4, wherein the deposition chamber is partitioned into two portions by a porous material.

8. The device of claim 4, wherein the deposition chamber is partitioned into a first portion comprising an evaporator and a second portion comprising a reactor maintained at a higher temperature than the first portion.

9. The device of claim 7, including mechanical means for receiving the injected droplets and for conveying them toward the deposition chamber, wherein the mechanical means comprise a conveyor band.

10. The device of claim 4, wherein the size of said droplets is controlled and duplicated by said injector.

11. A device for introducing into a chemical vapor deposition chamber partitioned into a first portion comprising an evaporator and a second portion comprising a reactor maintained at a higher temperature than the first portion, precursors of one or more elements to be deposited on a heated substrate disposed in the chamber, comprising:

a tank containing one or more said precursors in liquid form or in solution in a solvent, said solvent having a higher volatility than said precursors, means for maintaining said tank at a pressure higher than the pressure of the chamber, an injector associated with said tank, said injector provided with control means for controlling the amount of precursors to be introduced into the deposition chamber by periodically injecting a constant amount of said precursors in the form of droplets into the deposition chamber in a direction toward said heated substrate, each of said droplets having a duplicable volume, whereby the growth rate of said elements on said heated substrate are controlled, a second injector for injecting a counter-flow carrier gas having a flow counter to the flow of said droplets toward said heated substrate, and a second carrier gas having a flow toward said substrate, said counter-flow carrier gas and said second carrier gas injected at an intermediate location between said injector associated with said tank and said substrate, wherein said counter-flow carrier gas evacuates evaporated solvent portions of said droplets away from said substrate through a gas vent, and means for volatizing said injected precursor droplets to produce evaporated precursors, wherein said second carrier gas conveys said evaporated precursors toward said substrate.

* * * * *